United States Patent
Daftari et al.

(10) Patent No.: US 9,385,657 B1
(45) Date of Patent: Jul. 5, 2016

(54) TRIPLE BALANCED, INTERLEAVED MIXER

(71) Applicant: Northrop Grumman Systems Corporation, Falls Church, VA (US)

(72) Inventors: Naveen Daftari, Redondo Beach, CA (US); Tim LaRocca, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/674,379

(22) Filed: Mar. 31, 2015

(51) Int. Cl.
H03D 7/14 (2006.01)

(52) U.S. Cl.
CPC ........... *H03D 7/1458* (2013.01); *H03D 7/1441* (2013.01); *H03D 7/14* (2013.01); *H03D 7/1466* (2013.01)

(58) Field of Classification Search
CPC ......... H03D 7/01; H03D 7/14; H03D 7/1466; H03D 7/1458; H03D 7/144; H05K 3/30
USPC ............................ 327/355–361; 455/323, 326
See application file for complete search history.

(56) References Cited

U.S. PATENT DOCUMENTS

| | | | |
|---|---|---|---|
| 6,767,779 B2 | 7/2004 | Parker et al. | |
| 6,847,808 B2 * | 1/2005 | Zhou | H03D 7/1441 327/206 |
| 7,102,411 B2 | 9/2006 | Behzad | |
| 8,045,951 B2 * | 10/2011 | Lin | H03D 7/14 455/209 |
| 8,401,512 B2 * | 3/2013 | Buer | H03D 7/1441 331/96 |
| 8,829,572 B2 | 9/2014 | Jagannathan et al. | |
| 2011/0248766 A1 | 10/2011 | Buer | |
| 2011/0272705 A1 | 11/2011 | Hu et al. | |
| 2012/0242403 A1 | 9/2012 | Akhtar | |
| 2014/0171003 A1 | 6/2014 | Mikhemar et al. | |

FOREIGN PATENT DOCUMENTS

WO 2011121830 10/2011

OTHER PUBLICATIONS

Flament, A. et al; A combined 4-bit quadrature digital to analog converter/mixer for millimeter-wave applications; Electronics, Circuits, and Systems, 2009. ICECS 2009. 16th IEEE International Conference on, pp. 964,967, Dec. 13-16, 2009.

(Continued)

*Primary Examiner* — Dinh T Le
(74) *Attorney, Agent, or Firm* — Patti & Malvone Law Group, LLC

(57) ABSTRACT

A triple-balanced mixer is disclosed. The mixer features a complementary metal oxide semiconductor (CMOS) mmW (millimeter wave) integrated circuit and adds an inverted double balanced mixer to a double-balanced Gilbert cell mixer to provide a triple-balanced mixer. Another term for this type of mixer is doubly double balanced. Pairs of field effect transistor (FET) devices are interleaved into a single device. The inverted mixer provides an inverted LO feedthrough signal equal in amplitude to the LO feedthrough from the first mixer. The inverted LO feedthrough is used to cancel the LO feedthrough, or leakage, of the first mixer at the RF port.

17 Claims, 3 Drawing Sheets

(56) References Cited

OTHER PUBLICATIONS

Manjula, S. et al; Design and optimization of sub harmonic mixer with harmonic rejection for direct-down conversion receivers; Communication Software and Networks (ICCSN), 2011 IEEE 3rd International Conference on, pp. 592,595, May 27-29, 2011.

Hrobak, M. et al; A hybrid broadband microwave triple balanced mixer based on silicon crossed quad diodes; Microwave Conference (EuMC), 2012 42nd European, pp. 5,8, Oct. 29, 2012-Nov. 1, 2012.

Lai, Y. et al; Compact double-balanced star mixers with novel dual 180° hybrids; Solid-State and Integrated Circuit Technology (ICSICT), 2012 IEEE 11th International Conference on, pp. 1,4, Oct. 29, 2012-Nov. 1, 2012.

Imaoka, J. et al; Feasible evaluations of coupled multilayer chip inductor for POL converter; Power Electronics Conference (IPEC-Hiroshima 2014—ECCE-ASIA), 2014 International, pp. 883,890, May 18-21, 2014.

Do, M. N. et al; Double and triple balanced wideband mixers integrated in GaAs technology; Integrated Nonlinear Microwave and Millimeter-Wave Circuits (INMMIC), 2010 Workshop on, pp. 85,88, Apr. 26-27, 2010.

Yun, W. et al; A Triple Balanced Mixer in Multi-layer Liquid Crystalline Polymer (LCP) Substrate; Electronic Components and Technology Conference, 2007. ECTC '07. Proceedings. 57th, pp. 2000,2005, May 29, 2007-Jun. 1, 2007.

* cited by examiner

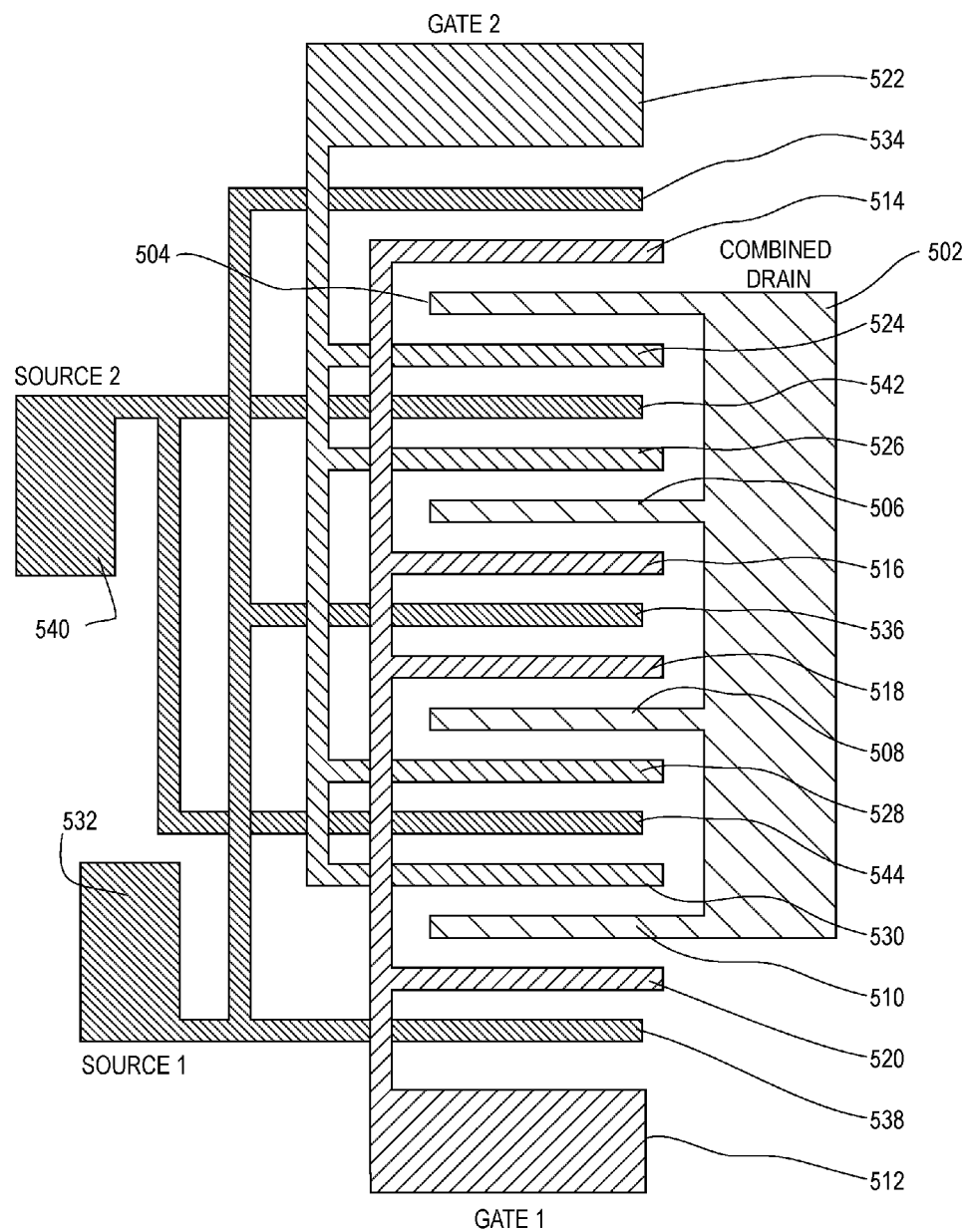

TRIPLE BALANCED, INTERLEAVED MIXER

STATEMENT OF GOVERNMENT RIGHTS

The Government of the United States of America has rights in this invention pursuant to Government Contract No. FA8650-10-C-7027.

FIELD OF THE INVENTION

The invention relates generally to mmW (millimeter wave) integrated circuits and more particularly to Gilbert cell mixers implemented in CMOS.

BACKGROUND

A mixer is a device used to combine two or more signals. For example, it is commonly used in radio frequency (RF) transmitters and receivers to down-convert signals from a high frequency (RF) to a lower frequency (IF) or vice versa using a local oscillator (LO). One type of mixer is referred to as a Gilbert cell and is implemented using transistors.

Mixers can have a variety of topologies. A single-balanced mixer up-converts or down-converts an input RF signal, but the LO signal still leaks through to the output. A double balanced mixer is provided with both polarities of a balanced signal and can therefore cancel out one of the signals you wish to cancel, typically the LO. In reality, however, even well designed mixers still have some LO leakage, also known as feedthrough.

One solution for minimizing leakage at the output of a mixer is adding a filter. However, this type of system requires a tradeoff between a higher frequency input signal and a lower frequency input signal. The higher frequency input signal results in a higher frequency output signal (given a fixed LO) and therefore a smaller filter with fewer elements. This is practical for on-chip realization, but is difficult on the digital-analog converter. On the other hand, a lower frequency input signal features a more difficult and impractical on-chip filter design.

A particular type of double balanced mixer, a double-balanced Gilbert cell, is shown in FIG. 1. Mixer 100 is shown configured for use as an up-converter, where a lower frequency (IF) is mixed with a LO signal to generate a higher frequency (RF) output. It includes six transistors that are field effect transistors (FETs) in a preferred embodiment but other switching components, such as bipolar junction transistors (BJTs) could also be used. The IF signal is connected to the gate terminal of transistor 102 and an inverse of the IF signal is connected to the gate terminal of transistor 104. The source terminals of transistors 102 and 104 are both connected to element 106, shown in FIG. 1 as a current source. Alternatively, element 106 could be a ground node if mixer 100 is being used as a down-converter.

The LO signal is connected the gate terminals of transistors 108 and 110 and an inverse of the LO signal is connected to the gate terminal of transistors 112 and 114. The source terminals of transistors 108 and 112 are both connected to the drain terminal of transistor 102. The source terminals of transistors 110 and 114 are both connected to the drain terminal of transistor 104. The output RF signal is provided at the drain terminals of transistors 108, 110, 112 and 114 at output 116.

A Gilbert cell mixer typically provides high LO signal leakage rejection however, prior art designs have been unable to completely eliminate LO signal leakage. One solution is to use a cancellation technique that externally splits the LO signal and combines it with the output signal of the mixer after passing it through an external phase shifter and a variable attenuator. This solution is difficult to implement on a single chip since there it requires a variety of components which are made using different manufacturing technologies. Further, the different routing paths for the LO signal (the mixer forms one path and the phase shifter/attenuator forms another path) often cause mismatched phase relationships between the two LO signals that result in imperfect LO signal leakage cancellation.

Thus, a need exists for a mixer circuit having a reduced LO feedthrough.

SUMMARY

In one exemplary embodiment, a complementary metal oxide semiconductor (CMOS) mmW integrated circuit is designed by adding an inverted double balanced mixer to a double-balanced Gilbert cell mixer to provide a triple-balanced mixer. Another term for this type of mixer is doubly double balanced. This is accomplished by interleaving pairs of field effect transistor (FET) devices into a single device. The inverted mixer provides an inverted LO feedthrough signal equal in amplitude to the LO feedthrough from the first mixer. The inverted LO feedthrough is used to cancel the LO feedthrough, or leakage, of the first mixer at the RF port.

A chip layout design using interleaving allows the merging of 12 devices to 6 devices, thereby adding the inverted double balanced Gilbert cell mixer without taking up significantly more space on the chip. Identical mixers with opposite LO signals ensures that the feedthrough LO from both mixers will be out of phase and of equal amplitude when combined.

The invention in one implementation encompasses an apparatus forming a triple-balanced mixer having a first plurality of field effect transistors (FETs) interconnected as a double-balanced mixer receiving a local oscillator (LO) signal; and a second plurality of FETs interleaved on a substrate with the first plurality of FETs and interconnected as a double-balanced mixer receiving the inverse of the LO signal; wherein a LO leakage signal in the output of the triple-balanced mixer is removed.

In a further embodiment, the invention encompasses a semiconductor device having a first plurality of field effect transistors (FETs) receiving a local oscillator (LO) signal at a gate terminal; a second plurality of FETs receiving an inverse of the LO signal at a gate terminal and interleaved with the first set of FETs such that a drain terminal each pair of the first and second pluralities are connected; a third plurality of FETs receiving an intermediate frequency (IF) signal at a gate terminal and connected to a source terminal of the first set of FETs at their drain terminal; and a fourth plurality of FETs receiving an inverse of the IF signal at a gate terminal and connected to a source terminal of the second set of FETs at their drain terminal, said fourth plurality of FETs interleaved with the third plurality of FETs such that the source terminals of each pair of the third and fourth pluralities are connected to each other.

In a further embodiment, the invention is fabricated using CMOS (Complementary Metal-Oxide-Semiconductor) on a silicon substrate.

In yet another embodiment, each transistor of the plurality of transistors includes a plurality of fingers, each of which are separately controlled.

In an embodiment, the device of the invention receives a low frequency IF (intermediate frequency) signal and up-converts the IF signal to a higher frequency RF (radio frequency) signal.

In a further embodiment, the device of the invention receives a high frequency RF (radio frequency) signal and down-converts the RF signal to a lower frequency IF (intermediate frequency) signal.

In another embodiment, the mixer includes a first pair of interleaved FETs having first and second source terminals coupled to a common source, first and second gate terminals connected to opposite polarities of an IF (intermediate frequency) signal and first and second drain terminals; a second pair of interleaved FETs comprises a third source terminal connected to the first drain terminal, a third gate terminal connected to a LO (local oscillator) signal, a fourth source terminal connected to the second drain terminal, a fourth gate terminal connected to an inverse of the LO signal, and drain terminals coupled together; and a third pair of interleaved FETs comprises a fifth source terminal connected to the first drain terminal, a fifth gate terminal connected to the inverse of the LO signal, a sixth source terminal connected to the second drain terminal, a sixth gate terminal connected to the LO signal, and drain terminals coupled to each other and the drain terminals of the second pair of interleaved FETs.

In yet another embodiment, the invention is operated as part of a transceiver.

DESCRIPTION OF THE DRAWINGS

Features of example implementations of the invention will become apparent from the description, the claims, and the accompanying drawings in which:

FIG. 5 shows a representation of a chip layout of interleaved transistors from FIG. 2.

DETAILED DESCRIPTION

Figure 1:
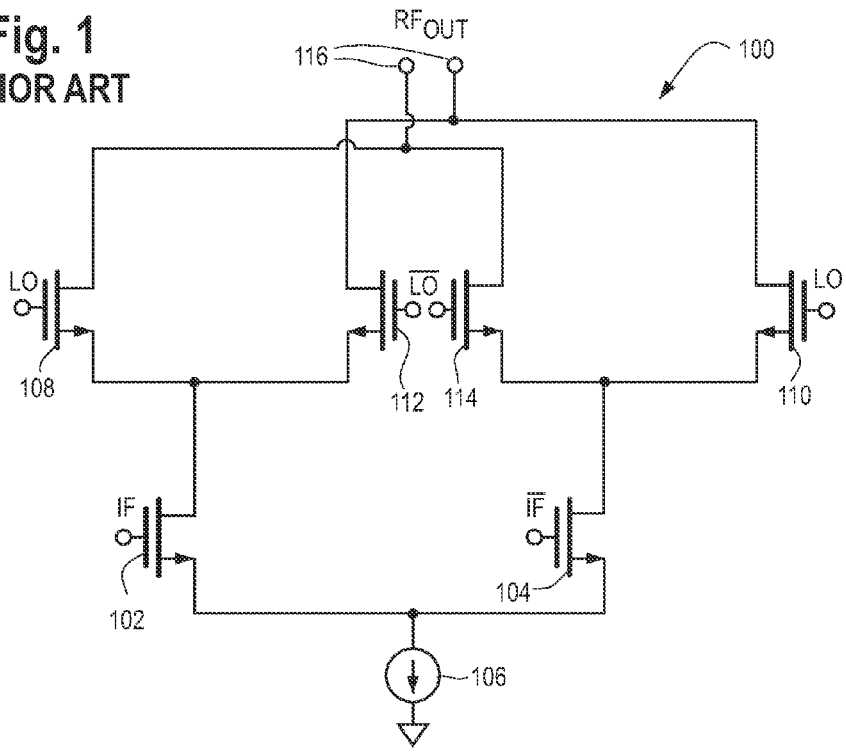
FIG. 1 shows a prior art double balanced Gilbert cell mixer.
Figure 2:
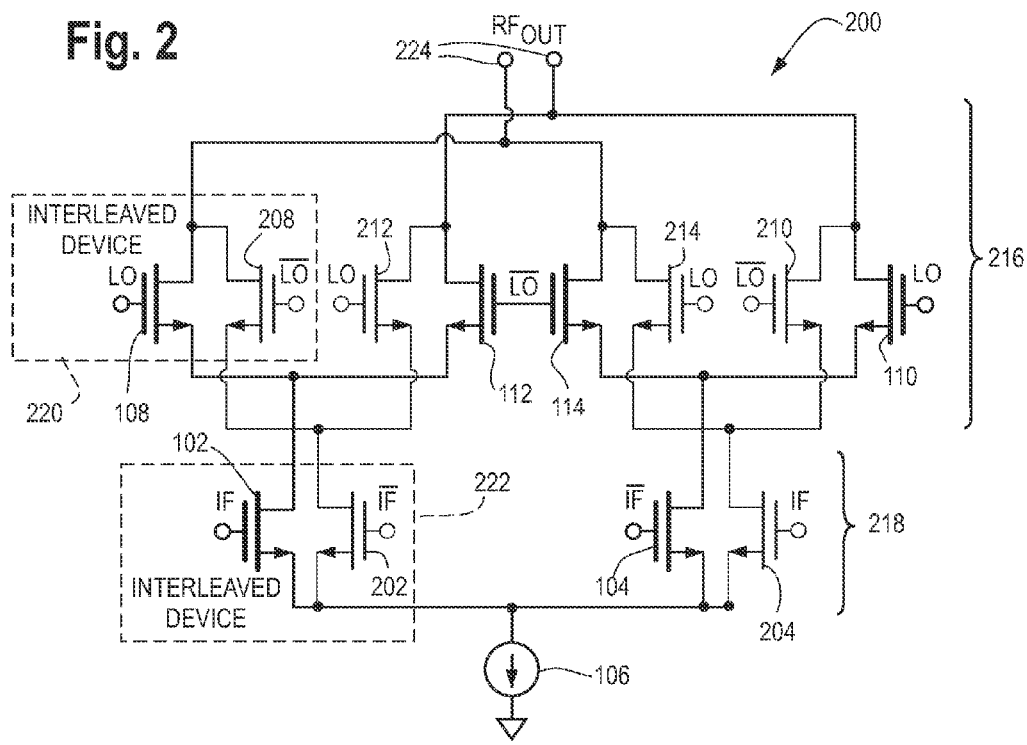
FIG. 2 shows a triple balanced Gilbert cell mixer according to the present invention.

A triple balanced mixer according to the present invention is shown in FIG. 2. FETs 102, 104, 108, 110, 112 and 114 function as a first double balanced mixer similar to that shown in FIG. 1 as indicated by the common reference numbers. FETs 202, 204, 208, 210, 212 and 214 form an inverted double balanced mixer. A top set of paired switching FETs is indicated generally at 216. In this set, FET 108 receiving the LO signal is paired with FET 208 which receives an inverse of the LO signal. In a similar manner, FETs 112 and 212, FETs 114 and 214, and FETs 110 and 210 each form pairs having different source terminals but sharing a common drain terminal. Each pair of FETS forms an interleaved device, as will be explained below in connection with FIGS. 4A-4C and 5.

Figure 3A:
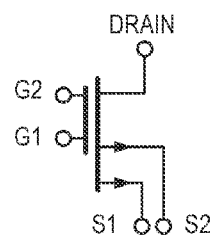
FIGS. 3A-3B show more detailed circuit diagrams of some of the transistors of FIG. 2.

An electrical circuit diagram for each of the FET pairs in top set 216 of FIG. 2 is shown in FIG. 3A. Taking, for example, the pair of FETs 108 and 208 inside box 220 of FIG. 2, FIG. 3A shows an interleaved device that has two gate controls G1 and G2, two sources S1 and S2 and a single Drain. Referring back to FIG. 2, the drain terminals of both FETs 108 and 208 are tied together and connected to RFout terminal 224. The two gate terminals are connected to the LO signal (G1 of FIG. 3A) and the inverse of the LO signal (G2 of FIG. 3A) respectively. The source terminal of FET 108 is connected to the drain of FET 102 while the source of FET 208 is connected to the drain of FET 202 as will be further described below.

Returning to FIG. 2, the bottom set 218 of FETs also includes matched pairs. In this case, FET 102 is paired with FET 202 while FET 104 is paired with FET 204. FETs 202 and 204 receive an IF signal that is the inverse of that received by FETs 102 and 204. Each pair of FETS forms an interleaved device, as will be explained below in connection with FIGS. 4A-4C.

Figure 3B:
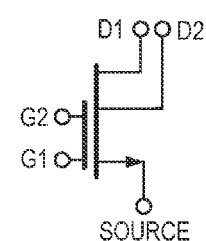

An electrical circuit diagram for the FET pairs in set 218 is shown in FIG. 3B. Taking, for example, the pair of FETs 102 and 202 inside box 222 of FIG. 2, FIG. 3B shows an interleaved device that has two gate controls G1 and G2, two drains D1 and D2 and a single Source. Referring back to FIG. 2, the source terminal of both FETs 102 and 202 are tied together and to current source 106. The two gate terminals are connected to the IF signal (G1 of FIG. 3B) and the inverse of the IF signal (G2 of FIG. 3B). The drain terminal of FET 102 is tied to the source terminal of FETs 108 and 112 while the drain terminal of FET 202 is connected to source terminals of FETs 208 and 212.

A variety of technologies are available for manufacturing Gilbert cell mixers. A MMIC (Monolithic Microwave Integrated Circuit) was originally fabricated using a III-V compound semiconductor such as GaAs (gallium arsenide) but may also use a silicon technology. One drawback of MMICs is the fact that they typically only feature one to two metal layers, making the design of complex interconnected circuits difficult or impractical.

In contrast, CMOS (Complementary Metal-Oxide-Semiconductor) is a method of fabricating integrated circuits, particularly transistors, that includes up to 20 metal layers, allowing much more complex circuit design. Transistors manufactured in CMOS are often physically laid out on the chip in fingers to facilitate the necessary connections between devices.

Figure 4A:
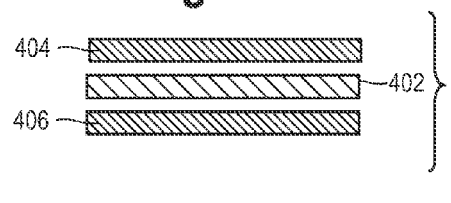
FIGS. 4A-4C show representations of the chip layout of interleaved transistors.
Figure 4B:
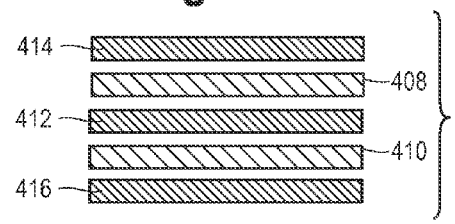
Figure 4C:
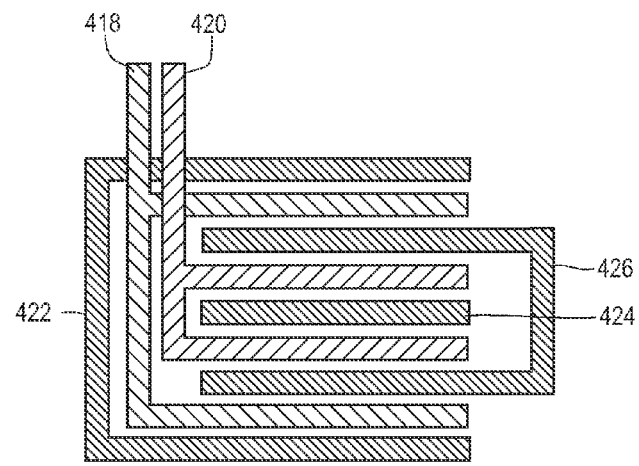

The chip layout of the circuit of FIG. 2 is discussed in more detail in connection with FIGS. 4A-4C. FIG. 4A depicts a representation of a single finger FET device, where a gate 402 is located between a drain 404 and a source 406. Often, to optimize various factors in the circuit design, especially as device sizes are reduced, a transistor will be split into several fingers as shown in FIG. 4B. Splitting a transistor into fingers also allows control over the size of the device on a chip. In one view, the device of FIG. 4B can be viewed as a single transistor where terminals 408 and 410 are tied together to form a gate terminal, fingers 414 and 416 are tied together to form a source terminal and finger 412 forms the drain. Alternatively, taking advantage of mmW silicon circuit design using CMOS, each finger of a FET device can be controlled separately and therefore, the device of FIG. 4B also represents two single finger devices interleaved into a single device with a common drain and separate gates and separate sources, similar to the device shown in FIG. 3A. In FIG. 4B, gate terminals 408 and 410 surround single drain terminal 412. Source terminals 414 and 416 are located on the opposite sides of gate terminals 408 and 410 respectively.

It is a feature of the invention that, taking advantage of mmW silicon circuit design using CMOS, each finger of a FET device can be controlled separately and thus, two FET devices can be interleaved into one device. This interleaving provides for merging 12 devices to 6 devices, thereby allowing an additional double balanced Gilbert cell mixer to be added to a first double balanced Gilbert cell mixer, minimizing the difficulties in routing RF/IF/LO signals while providing the benefit of maintaining proper phase relationships. In other words, the LO leakage signal and its inverse are generated with identical circuits having identical path lengths, which ensures the desired LO leakage signal cancellation.

According to a further embodiment, multiple finger devices are also be interleaved. A representation of a pair of interleaved two finger devices is shown in FIG. 4C. First and second gate terminals are shown at 418 and 420. A first source terminal is shown in 422 and a second source terminal is shown at 424. Finally, a drain terminal is shown at 426.

FIG. 5 depicts a representation of interleaved transistors from set 220 of FIG. 2. In particular, FIG. 5 shows one possible chip layout for A combined drain 502 corresponds to RFout terminal 224 of FIG. 2. Drain 502 has 4 fingers 504, 506, 508 and 510, each of which forms the combined output of one of the transistor pairs in set 216 of FIG. 2. Gate 1, denoted by 504, is connected to the LO signal, for example, and fingers 514, 516, 518 and 520. Gate 2, denoted by 522, is connected to the inverse of the LO signal, for example, as well as fingers 524, 526, 528 and 530. Similarly, Source 1, denoted by 532, is connected to fingers 534, 536 and 538. Source 2, denoted by 540, is connected to fingers 542 and 544. In an embodiment, Source 1 is connected to the drain of transistor 102 of FIG. 2 and Source 2 is connected to the drain of transistor 202, but alternative connections are possible.

The source and gate terminals of transistor 108 of FIG. 2 are formed, for example, from fingers 534, 514, 516, 526, 518, 520 and 538 of FIG. 5. The source and gate terminals of transistor 208 of FIG. 3 are formed, for example, from fingers 524, 542, 526, 528, 544 and 530.

In an embodiment, the device exploits the advantages of silicon RF CMOS and customizes how the terminals of a FET device are tapped, by interleaving the fingers of the device. This allows implementation of a triple balanced mixer by adding two double balanced Gilbert cell mixers so that the LO leakage can be eliminated. In an up converter, this allows the use of a lower IF signal from a digital analog converter (DAC), for example, which takes the burden off the DAC. It also reduces the difficult rejection criteria for large filter designs, which are difficult on CMOS. Compact nature of interleaving allows for practical routing of signals to accomplish a triple balanced mixer on-chip, providing a high performing circuit with a small footprint. The circuit provides improved performance and lower requirements from other circuit components, thereby also lowering the power requirements from DACs and filters. This circuit would be ideal for direct conversion systems where LO feedthrough can be critical for signal detection.

A triple-balanced Gilbert cell mixer according to the present invention would find use in the any type of communication system that makes use of a transceiver or receiver that requires high out of band rejection for all other spurious signals generated by the system, especially any transceiver that needs high LO isolation, for example, a direct-conversion architecture or homodyne. Typically, the LO is the main culprit of out of band spurious signals because it is typically a very strong signal to begin with.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

For example, the devices of the present invention could also be fabricated as bipolar junction transistors (BJTs). In addition, the specific location of individual fingers of the device could be varied as understood by one of ordinary skill in the art.

What is claimed is:

1. A triple-balanced mixer comprising:
   a first plurality of field effect transistors (FETs) interconnected as a first double-balanced mixer receiving an input signal and a local oscillator (LO) signal; and
   a second plurality of FETs paired with and interleaved on a substrate with the first plurality of FETs and interconnected as an inverted double-balanced mixer, each FET receiving an inverse of the input signal and the LO signal relative to its paired FET;
   wherein a LO leakage signal in an output signal of the triple-balanced mixer is removed.

2. The triple-balanced mixer of claim 1, wherein the mixer is fabricated using CMOS (Complementary Metal-Oxide-Semiconductor) technology on a silicon substrate.

3. The triple-balanced mixer of claim 2, wherein each transistor of the plurality of transistors further comprises a plurality of fingers on the silicon substrate.

4. The triple-balanced mixer of claim 1, wherein the input signal is a low frequency IF (intermediate frequency) signal and the triple-balanced mixer up-converts the IF signal to a higher frequency RF (radio frequency) signal.

5. The triple-balanced mixer of claim 1, wherein the input signal is a high frequency RF (radio frequency) signal and the triple-balanced mixer down-converts the RF signal to a lower frequency IF (intermediate frequency) signal.

6. The triple-balanced mixer of claim 1, wherein the mixer is operated as part of a transceiver.

7. The semiconductor device of claim 1, wherein the device is operated as part of a transceiver.

8. The triple-balanced mixer of claim 1, wherein said first plurality of FETs further comprises a first set FETs having source terminals coupled to each other and receiving the LO signal and the inverse of the LO signal at gate terminals, a second set FETs having source terminals coupled to each other and receiving the inverse of LO signal and the LO signal at gate terminals, a first FET receiving the input signal at a gate terminal and having a drain terminal coupled to the source terminals of the first set of FETs, and a second FET receiving the inverse of the input signal at a gate terminal and having a drain terminal coupled to the source terminals of the second set of FETs.

9. The triple-balanced mixer of claim 8, wherein the second plurality of FETs further comprises a third set of FETs paired and interleaved with the first set, the third set having source terminals coupled to each other and receiving an LO signal of the opposite polarity to its paired FET from the first set at gate terminals, a fourth set of FETs having source terminals coupled to each other and receiving an LO signal of the opposite polarity its paired FET from the second set at gate terminals, a third FET paired with the first FET receiving an inverse of the input signal at a gate terminal and having a drain terminal coupled to the source terminals of the third set of FETs, and a fourth FET receiving the input signal at a gate terminal and having a drain terminal coupled to the source terminals of the fourth set of FETs.

10. A semiconductor device comprising:
   a first plurality of field effect transistors (FETs) receiving a local oscillator (LO) signal at a gate terminal;
   a second plurality of FETs paired with the first plurality of FETs and each receiving an inverse of the LO signal relative to its paired FET at a gate terminal, said second plurality of FETs interleaved with the first plurality of FETs such that a drain terminal each pair of the first and second pluralities are connected;

a third plurality of FETs receiving an input signal at a gate terminal and connected to a source terminal of the first set of FETs at their drain terminal;

a fourth plurality of FETs paired with the third plurality of FETs and each receiving an inverse of the input signal relative to its paired FET at a gate terminal and connected to a source terminal of the second plurality of FETs at their drain terminal, said fourth plurality of FETs interleaved with the third plurality of FETs such that the source terminals of each pair of the third and fourth pluralities are connected to each other.

11. The semiconductor device of claim 10, wherein the device is fabricated using CMOS (Complementary Metal-Oxide-Semiconductor) technology on a silicon substrate.

12. The semiconductor device of claim 11, wherein each transistor of the first, second, third and fourth pluralities of transistors further comprises a plurality of fingers on the silicon substrate.

13. The semiconductor device of claim 10, wherein the device comprises a triple-balanced mixer.

14. The semiconductor device of claim 13, wherein the device further receives a low frequency IF (intermediate frequency) signal and up-converts the IF signal to a higher frequency RF (radio frequency) signal.

15. The semiconductor device of claim 13, wherein the device further receives a high frequency RF (radio frequency) signal and down-converts the RF signal to a lower frequency IF (intermediate frequency) signal.

16. The semiconductor device of claim 10, wherein the first and second pluralities of FETs are interleaved by pairs on a substrate.

17. The semiconductor device of claim 10, wherein the third and fourth pluralities of FETs are interleaved by pairs on a substrate.

* * * * *